US012342554B2

(12) United States Patent
Wan et al.

(10) Patent No.: US 12,342,554 B2
(45) Date of Patent: Jun. 24, 2025

(54) METHOD FOR FABRICATING ARRAY STRUCTURE OF COLUMNAR CAPACITOR AND SEMICONDUCTOR STRUCTURE

(71) Applicant: CHANGXIN MEMORY TECHNOLOGIES, INC., Hefei (CN)

(72) Inventors: Qiang Wan, Hefei (CN); Jun Xia, Hefei (CN); Kangshu Zhan, Hefei (CN); Sen Li, Hefei (CN); Tao Liu, Hefei (CN); Penghui Xu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 482 days.

(21) Appl. No.: 17/951,122

(22) Filed: Sep. 23, 2022

(65) Prior Publication Data

US 2023/0015120 A1    Jan. 19, 2023

Related U.S. Application Data

(63) Continuation of application No. PCT/CN2022/072658, filed on Jan. 19, 2022.

(30) Foreign Application Priority Data

Aug. 24, 2021    (CN) .................. 202110973561.X (51) Int. Cl.
*H10D 1/68*    (2025.01)
*H01L 21/283*    (2006.01)
(Continued)

(52) U.S. Cl.
CPC ............. *H10D 1/68* (2025.01); *H01L 21/283* (2013.01); *H01L 21/31144* (2013.01); *H10B 12/00* (2023.02)

(58) Field of Classification Search
None
See application file for complete search history.

(56) References Cited

U.S. PATENT DOCUMENTS

2012/0190166 A1*  7/2012  Okuda ............. H01L 21/31144
                                                      257/E21.258
2013/0147048 A1*  6/2013  Kuh ...................... H10D 1/716
                                                      257/768
(Continued)

FOREIGN PATENT DOCUMENTS

CN    110010604 A    7/2019
CN    110504284 A    11/2019
(Continued)

OTHER PUBLICATIONS

CN 110010604A, Kim et al, Semiconductor Device and Manufacturing Method, Jul. 12, 2019 (Year: 2019).*

*Primary Examiner* — Alexander G Ghyka
(74) *Attorney, Agent, or Firm* — Kilpatrick Townsend & Stockton LLP (57) ABSTRACT

Embodiments provide a method for fabricating an array structure of a columnar capacitor and a semiconductor structure, relating to the field of semiconductor manufacturing technology. In the method, before a mask layer is removed, a thickness of the mask layer in the peripheral region is first adjusted to be equal to a thickness of the mask layer in the array region, thereby avoiding damage to a top support layer caused by different thicknesses of the mask layer. Moreover, in the method, a thickness of the top support layer is increased by means of a supplementary support layer, to increase support strength of the top support layer, thereby further preventing occurrence of tilt of the columnar capacitor due to insufficient support strength of the top support layer.

13 Claims, 9 Drawing Sheets (51) Int. Cl.
*H01L 21/311* (2006.01)
*H10B 12/00* (2023.01)

(56) References Cited

U.S. PATENT DOCUMENTS

| | | | |
|---|---|---|---|
| 2013/0161787 A1* | 6/2013 | Kim | H10D 89/10 |
| | | | 257/532 |
| 2014/0134839 A1 | 5/2014 | Kim et al. | |
| 2015/0132942 A1* | 5/2015 | Kim | H01L 23/53295 |
| | | | 438/618 |
| 2017/0200616 A1* | 7/2017 | Min | H01L 21/3086 |
| 2017/0345886 A1 | 11/2017 | Yi et al. | |
| 2020/0098763 A1* | 3/2020 | Bae | H01L 21/0337 |
| 2020/0135841 A1* | 4/2020 | West | H01L 21/31144 |

FOREIGN PATENT DOCUMENTS

| | | |
|---|---|---|
| CN | 111725139 A | 9/2020 |
| CN | 111771279 A | 10/2020 |
| CN | 112908968 A | 6/2021 |
| CN | 112951768 A | 6/2021 |
| CN | 113497187 A | 10/2021 |
| CN | 113707614 A | 11/2021 |

* cited by examiner

METHOD FOR FABRICATING ARRAY STRUCTURE OF COLUMNAR CAPACITOR AND SEMICONDUCTOR STRUCTURE

CROSS REFERENCE TO RELATED APPLICATION

The present disclosure is a continuation of PCT/CN2022/072658, filed on Jan. 19, 2022, which claims priority to Chinese Patent Application No. 202110973561.X titled "METHOD FOR FABRICATING ARRAY STRUCTURE OF COLUMNAR CAPACITOR AND SEMICONDUCTOR STRUCTURE" and filed on Aug. 24, 2021, the entire contents of which are incorporated herein by reference.

TECHNICAL FIELD

The present disclosure relates to the field of semiconductor manufacturing technology, and more particularly, to a method for fabricating an array structure of a columnar capacitor and a semiconductor structure.

BACKGROUND

As a semiconductor memory device commonly used in computers, dynamic random access memory (DRAM) includes many repeated memory cells. In processes of fabricating the DRAM below 20 nm, the DRAM uses stacked capacitor structures in most cases, and a capacitor of the DRAM is a vertical columnar capacitor with a high depth-to-width ratio.

Because the columnar capacitor has a high depth-to-width ratio, to increase stability of the columnar capacitor, it is generally necessary to provide a support layer to support the columnar capacitor. A defect in an existing method for fabricating a columnar capacitor is as follows: A top support layer is easily worn. Consequently, support strength of the top support layer is insufficient, and the columnar capacitor may be caused to tilt or even peeling, thereby affecting the performance of the columnar capacitor.

Therefore, it is necessary to provide a method for fabricating an array structure of a columnar capacitor, to resolve a problem in the prior art that the top support layer is easy to be worn, and the like.

SUMMARY

Some embodiments of the present disclosure provide a method for fabricating an array structure of a columnar capacitor and a semiconductor structure.

According to some embodiments of the present disclosure, one aspect of the present disclosure provides a method for fabricating an array structure of a columnar capacitor, including: providing a substrate provided with multiple conductive pads therein, wherein a first sacrificial layer, an intermediate support layer, a second sacrificial layer, an initial support layer, and a mask layer are stacked on the substrate, the substrate being divided into an array region and a peripheral region, a thickness of a mask layer positioned in the array region being less than a thickness of a mask layer positioned in the peripheral region, and multiple capacitor holes in the array region penetrating through the mask layer, the initial support layer, the second sacrificial layer, the intermediate support layer and the first sacrificial layer, to expose the multiple conductive pads; filling a conductive material in the multiple capacitor holes to form a lower electrode of the columnar capacitor, wherein the lower electrode is electrically connected to the multiple conductive pads; removing a part of the mask layer in the peripheral region, such that a thickness of a remaining part of the mask layer in the peripheral region is equal to a thickness of the mask layer in the array region; removing the remaining part of the mask layer in the peripheral region and the mask layer in the array region to expose the initial support layer; forming a supplementary support layer on the initial support layer, wherein the initial support layer and the supplementary support layer jointly function as a top support layer; patterning the top support layer and removing the second sacrificial layer; patterning the intermediate support layer and removing the first sacrificial layer; forming a dielectric layer, wherein the dielectric layer covers exposed surfaces of the substrate, the lower electrode, the intermediate support layer, and the top support layer; and forming an upper electrode, wherein the upper electrode covers a surface of the dielectric layer.

Another aspect of the embodiments of the present disclosure also provides a semiconductor structure, which includes: a substrate, wherein multiple conductive pads are arranged in the substrate, the substrate being divided into an array region and a peripheral region; a first sacrificial layer, an intermediate support layer, a second sacrificial layer, and a top support layer stacked on the substrate, wherein a surface of the top support layer positioned in the array region is flush with a surface of the top support layer positioned in the peripheral region, and the top support layer comprising an initial support layer and a supplementary support layer covering the initial support layer; and a lower electrode arranged in the array region, wherein the lower electrode penetrates through the top support layer, the second sacrificial layer, the intermediate support layer and the first sacrificial layer, and is electrically connected to the conductive pad.

BRIEF DESCRIPTION OF THE DRAWINGS

To describe the technical solutions of the embodiments of the present disclosure more clearly, the accompanying drawings required for describing the embodiments of the present disclosure will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

To make the objectives, technical means and effects of the present disclosure clearer, the present disclosure will be further described below with reference to the accompanying drawings. It should be understood that the embodiments described herein are some but not all of the embodiments of the present disclosure, and are not intended to limit the present disclosure. All other embodiments obtained by a person of ordinary skill in the art based on the embodiments of the present disclosure without creative efforts shall fall within the protection scope of the present disclosure.

FIGS. 1A to 1D are schematic cross-sectional views of a semiconductor structure corresponding to a main process for forming a lower electrode of an array structure of a columnar capacitor according to a first embodiment of the present disclosure.

Figure 1A:
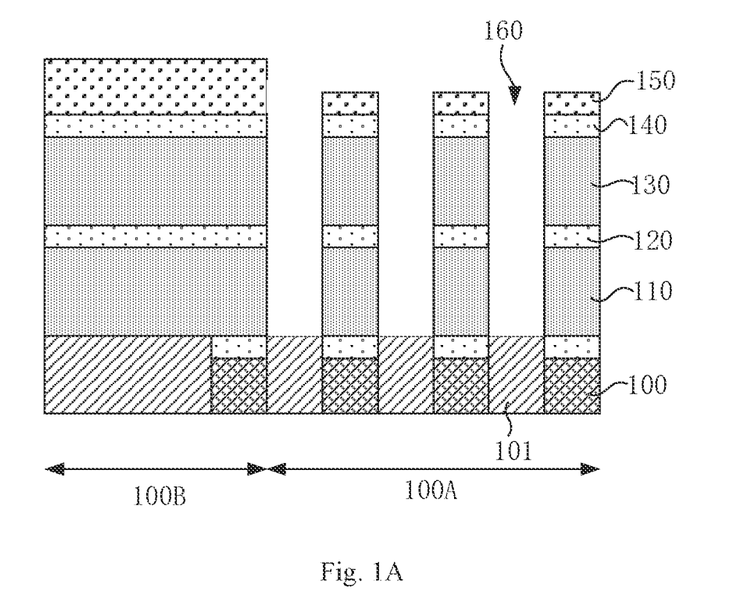
FIGS. 1A to 1D are schematic cross-sectional views of a semiconductor structure corresponding to a main process for forming a lower electrode of an array structure of a columnar capacitor according to a first embodiment of the present disclosure.

Referring to FIG. 1A, a substrate 100 is provided. Multiple conductive pads 101 are arranged in the substrate 100. A first sacrificial layer 110, an intermediate support layer 120, a second sacrificial layer 130, a top support layer 140 and a mask layer 150 are stacked on the substrate 100. The substrate 100 is divided into an array region 100A and a peripheral region 100B, and a thickness of the mask layer 150 positioned in the array region 100A is less than that of the mask layer 150 positioned in the peripheral region 100B. In the array region 100A, multiple capacitor holes 160 penetrate through the mask layer 150, the initial support layer 140, the second sacrificial layer 130, the intermediate support layer 120 and the first sacrificial layer 110, to expose the conductive pads 101.

Figure 1B:
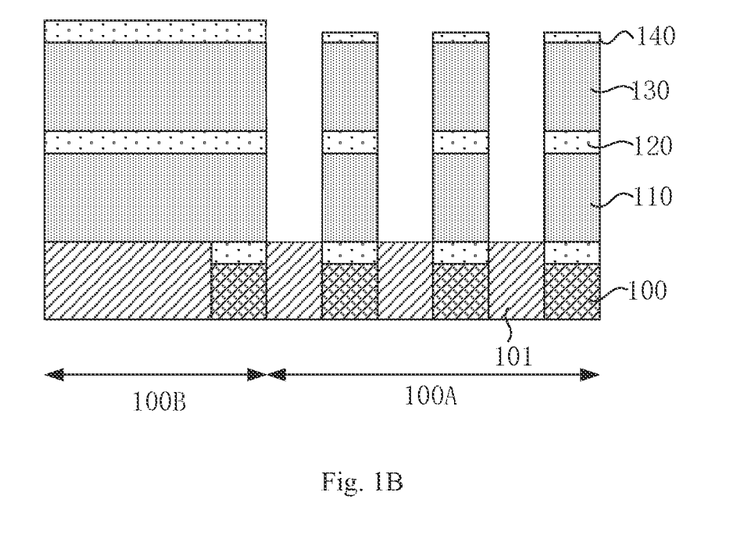

Referring to FIG. 1B, the mask layer 150 is removed. In this step, the thickness of the mask layer 150 in the peripheral region 100B is greater than the thickness of the mask layer 150 in the array region 100A. Therefore, if the mask layer 150 in the peripheral region 100B is entirely removed, the top support layer 140 of the array region 100A may be worn down, and thus becomes thin than that of the peripheral region 100B.

Figure 1C:
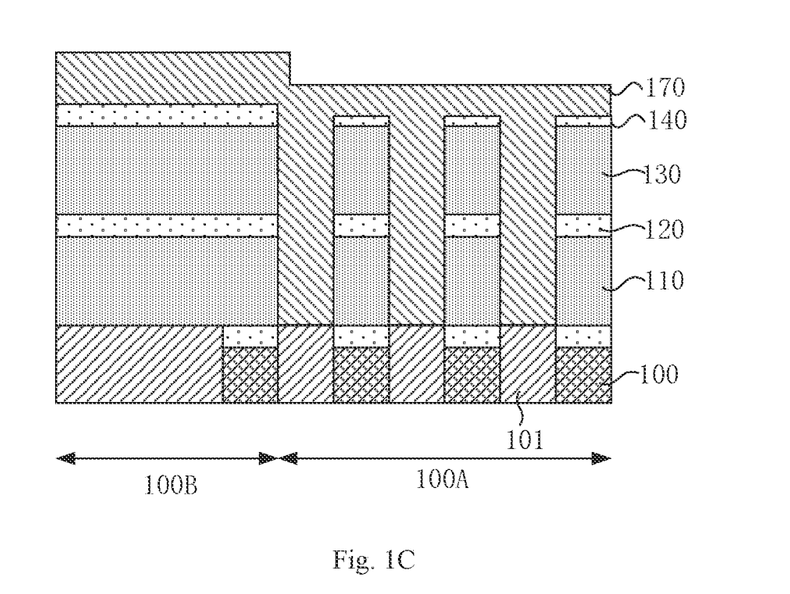

Referring to FIG. 1C, a conductive material 170 is filled. The conductive material 170 is filled into the capacitor hole 160 and covers a surface of the top support layer 140. In this step, a thickness of a conductive material 170 deposited in the peripheral region 100B is greater than a thickness of a conductive material 170 deposited in the array region 100A.

Figure 1D:
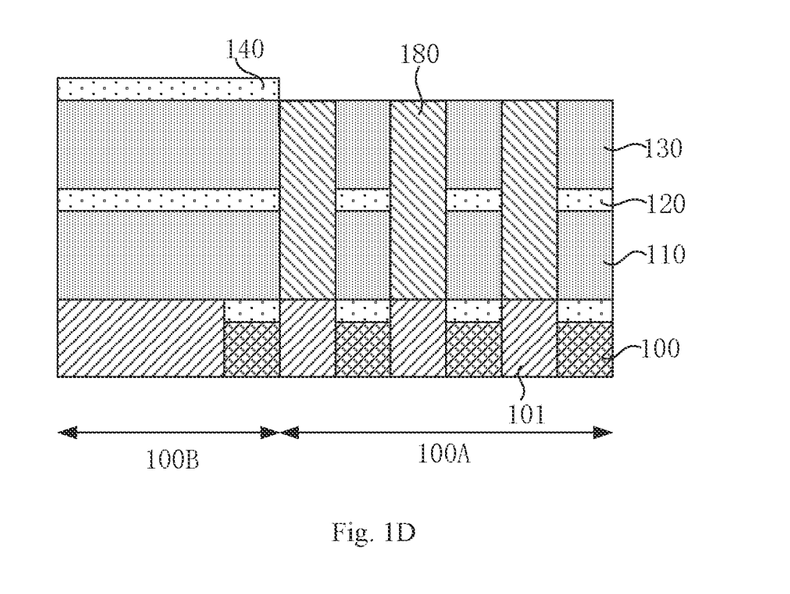

Referring to FIG. 1D, the conductive material 170 on the surface of the top support layer 140 is removed, and a lower electrode 180 is formed in the capacitor hole 160. In this step, a thickness of the conductive material 170 deposited in the peripheral region 100B is greater than that of the conductive material deposited in the array region 100A. Therefore, if the conductive material in the peripheral region 100B is entirely removed, the thickness of the top support layer 140 of the array region 100A is further reduced, or even the top support layer 140 of the array region 100A is completely removed. Consequently, a subsequently formed columnar capacitor has insufficient top support strength, and is prone to tilt, thereby having a negative effect on performance of the array structure of the columnar capacitor, and thus adversely affecting the performance of a memory, and reducing yield of the memory.

To solve the foregoing technical problem, a second embodiment of the present disclosure further provides a method for fabricating the array structure of the columnar capacitor, which can prevent causing damage to the top support layer, increase the thickness and the support strength of the top support layer, prevent the columnar capacitor from tilting, improve the performance of the columnar capacitor, and increase the yield of the memory. In some embodiments, in the method for fabricating the array structure of the columnar capacitor in the present disclosure, before the mask layer is removed, the thickness of the mask layer in the peripheral region is first adjusted to be equal to the thickness of the mask layer in the array region, thereby avoiding causing damage to the top support layer due to different thicknesses of the mask layer. Moreover, in the method, the thickness of the top support layer is increased by means of the supplementary support layer, to increase support strength of the top support layer, thereby further preventing occurrence of tilt of the columnar capacitor due to insufficient support strength of the top support layer.

Figure 2:
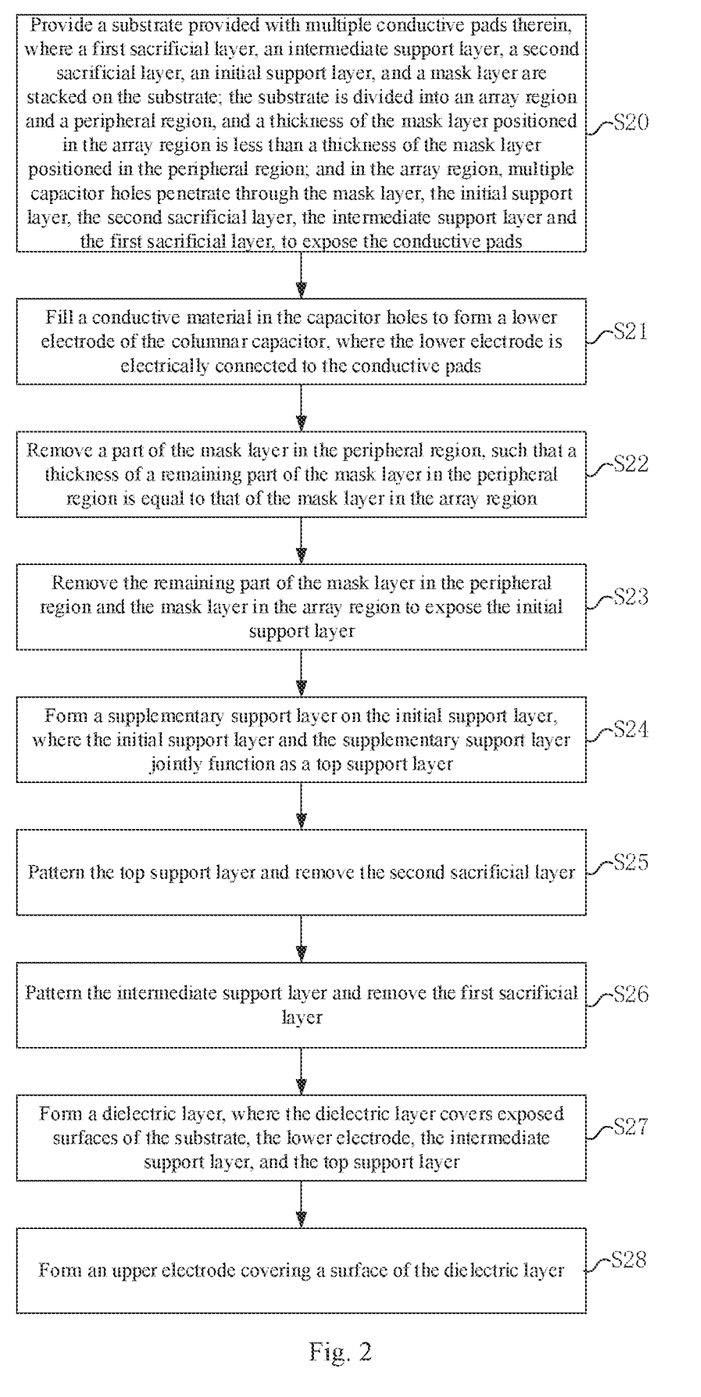
FIG. 2 is a schematic diagram of steps of a method for fabricating the array structure of the columnar capacitor according to a second embodiment of the present disclosure.

FIG. 2 is a schematic diagram of steps of the method for fabricating the array structure of the columnar capacitor according to the second embodiment of the present disclosure. Referring to FIG. 2, the method includes following steps. Step S20, providing a substrate provided with multiple conductive pads therein, where a first sacrificial layer, an intermediate support layer, a second sacrificial layer, an initial support layer, and a mask layer are stacked on the substrate. The substrate is divided into an array region and a peripheral region, where a thickness of the mask layer positioned in the array region is less than that of the mask layer positioned in the peripheral region. In the array region, multiple capacitor holes penetrate through the mask layer, the initial support layer, the second sacrificial layer, the intermediate support layer and the first sacrificial layer, to expose the multiple conductive pads. Step S21, filling a conductive material in the capacitor holes to form a lower electrode of the columnar capacitor, where the lower electrode is electrically connected to the conductive pads. Step S22, in the peripheral region, removing a part of the mask layer such that a thickness of a remaining part of the mask layer in the peripheral region is equal to the thickness of the mask layer in the array region. Step S23, removing the remaining part of the mask layer in the peripheral region and the mask layer in the array region to expose the initial support layer. Step S24, forming a supplementary support layer on the initial support layer, where the initial support layer and the supplementary support layer jointly function as the top support layer. Step S25, patterning the top support layer and removing the second sacrificial layer. Step S26, patterning the intermediate support layer and removing the first sacrificial layer. Step S27, forming a dielectric layer, where the dielectric layer covers exposed surfaces of the substrate, the lower electrode, the intermediate support layer, and the top support layer. Step S28, forming an upper electrode, where the upper electrode covers a surface of the dielectric layer.

FIGS. 3A to 3L are schematic cross-sectional views of the main semiconductor structure formed by using the method according to an embodiment of the present disclosure.

Figure 3A:
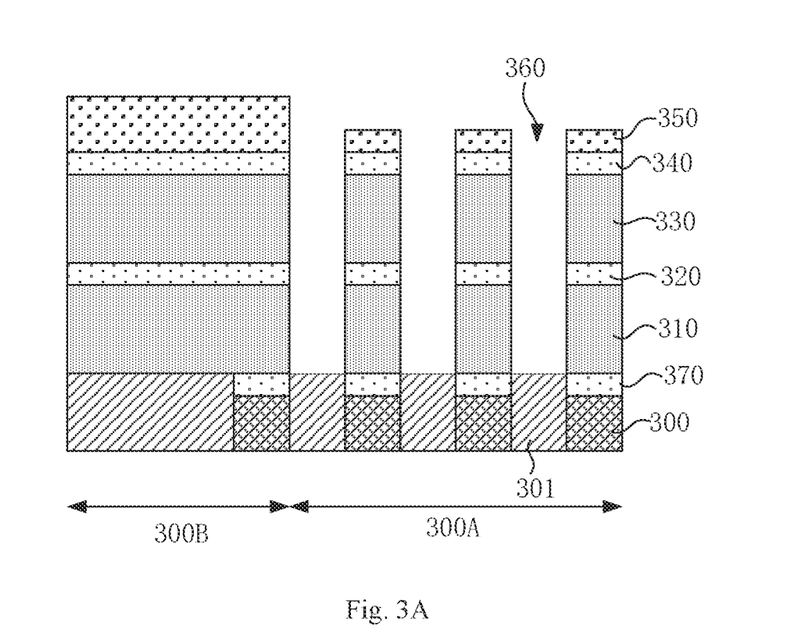
FIGS. 3A to 3L are schematic cross-sectional views of a main semiconductor structure formed by using the method according to the second embodiment of the present disclosure.

In Step S20, referring to FIG. 3A, a substrate 300 is provided. Multiple conductive pads 301 are arranged in the substrate 300. A first sacrificial layer 310, an intermediate support layer 320, a second sacrificial layer 330, an initial support layer 340 and a mask layer 350 are stacked on the substrate 300. The substrate 300 is divided into an array region 300A and a peripheral region 300B, and a thickness of the mask layer 350 positioned in the array region 300A is less than that of the mask layer 350 positioned in the peripheral region 300B. In the array region 300A, multiple capacitor holes 360 penetrate through the mask layer 350, the initial support layer 340, the second sacrificial layer 330, the intermediate support layer 320 and the first sacrificial layer 310, to expose the conductive pads 301.

The substrate 300 may include a silicon substrate, a germanium (Ge) substrate, a silicon germanium (SiGe) substrate, a silicon-on-insulator (SOI) substrate or a germanium-on-insulator (GOI) substrate, etc. The substrate 300 may also be a substrate including other elemental semiconductors or compound semiconductors, such as gallium arsenide, indium phosphide, or silicon carbide, etc., and the substrate 300 may also be a stacked structure, such as a silicon/germanium silicon stack, etc. In addition, the substrate 300 may be an ion-doped substrate, which may be P-type doped or N-type doped. In the substrate 300, a plurality of peripheral devices may also be formed, such as field effect transistors, capacitors, inductors and/or P-N junction diodes, etc. In this embodiment, the substrate 300 is the silicon substrate, which further includes other device structures, such as a bit line structure, a transistor structure, etc., which are not shown because they are not related to the present disclosure.

In this embodiment, a material of the first sacrificial layer 310 and a material of the second sacrificial layer 330 may be oxides such as silicon oxide; and a material of the intermediate support layer 320 and a material of the initial support layer 340 may be nitrides such as silicon nitride. A material of the mask layer 350 may be polysilicon.

In this embodiment, a bottom support layer 370 is further provided on the substrate 300. The bottom support layer 370 covers the substrate 300 and exposes the conductive pads 301, and the first sacrificial layer 310 covers the bottom support layer 370. A material of the bottom support layer 370 may be nitrides such as silicon nitride.

Figure 3B:
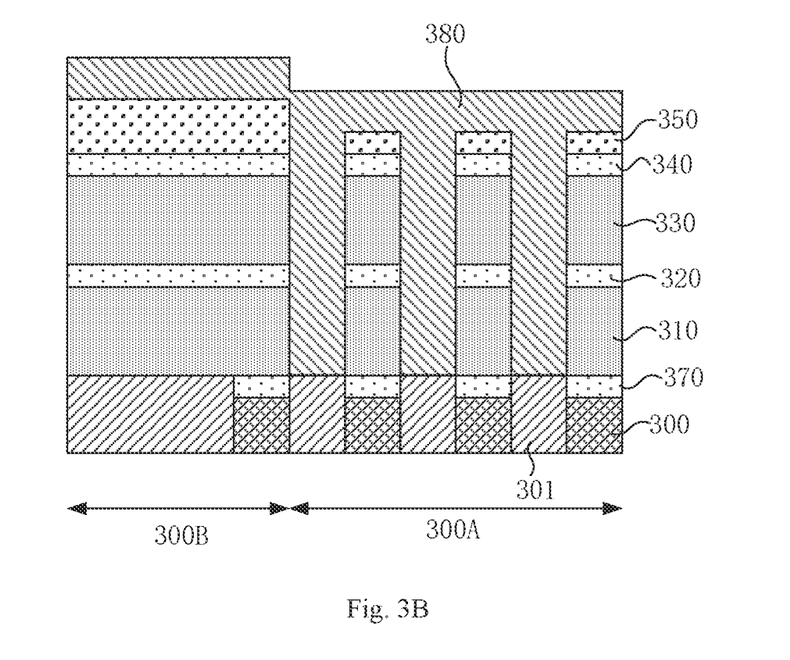
Figure 3C:
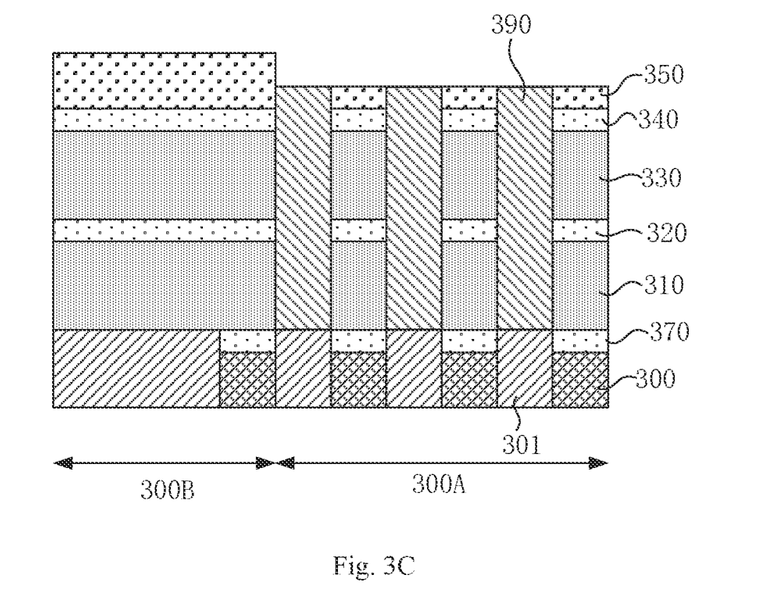

Step S21, referring to FIG. 3B and FIG. 3C, filling a conductive material in the capacitor holes 360 to form a lower electrode 390 of the columnar capacitor, where the lower electrode 390 is electrically connected to the conductive pads 301.

In this step, the lower electrode 390 is formed in the capacitor holes 360. In this embodiment, the step includes the following steps.

Referring to FIG. 3B, a conductive material 380 is filled in the capacitor holes 360, where the conductive material 380 not only fills the capacitor holes 360, but also covers the surface of the mask layer 350 the array region 300A and the surface of the mask layer 350 in the peripheral region 300B. The conductive material may be a titanium nitride material or other materials that may be used as the lower electrode of the columnar capacitor.

Referring to FIG. 3C, the conductive material 380 is etched back to expose the mask layer 350, and the conductive material in the capacitor holes 360 forms the lower electrode 390. In this embodiment, in this step, the conductive material 380 is etched back by using a titanium nitride etch-back process to remove the conductive material 380 on the surface of the mask layer 350, until the mask layer 350 is exposed.

Figure 3D:
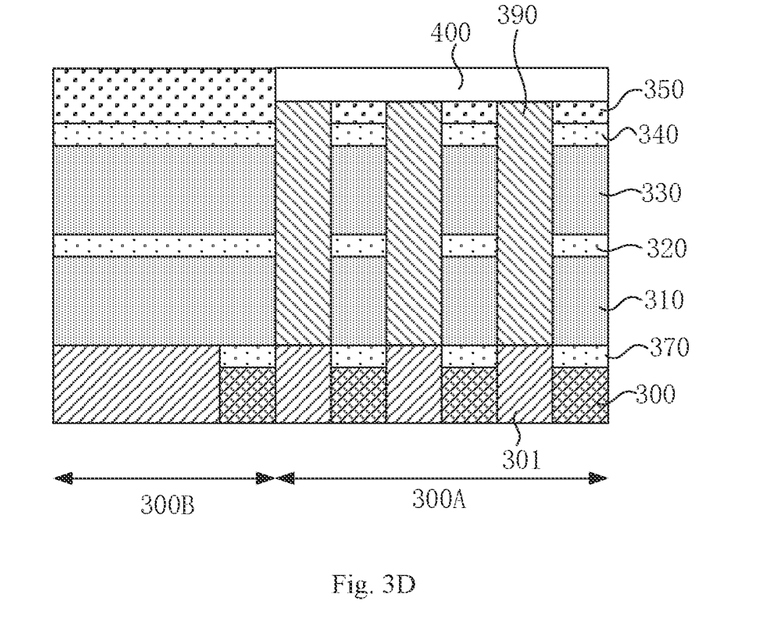
Figure 3E:
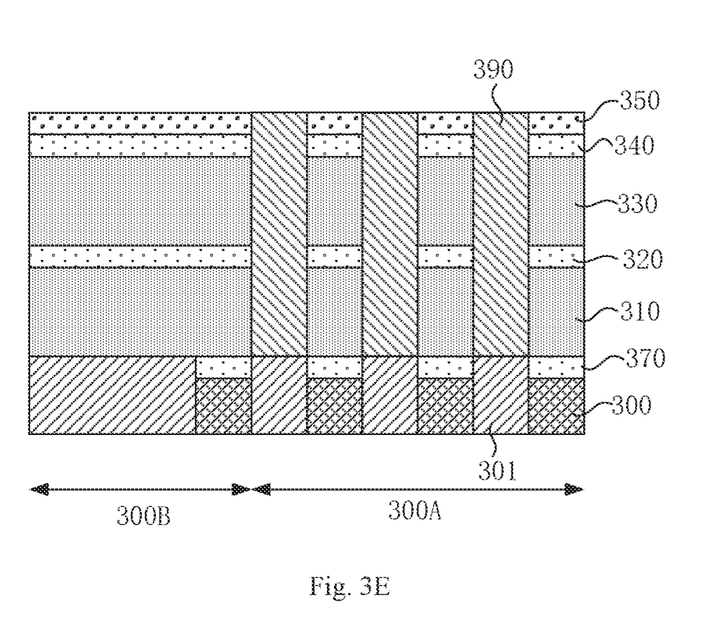

Step S22, referring to FIG. 3D and FIG. 3E, in the peripheral region 300B, part of the mask layer 350 is removed, such that the thickness of the remaining mask layer 350 in the peripheral region 300B is equal to the thickness of the mask layer 350 in the array region 300A.

A purpose of this step is to remove a height difference between a mask layer 350 in a peripheral region 300B and a mask layer 350 in an array region 300A. A thickness of a remaining mask layer 350 in the peripheral region 300B is equal to a thickness of the mask layer 350 in the array region 300A, such that when the mask layer 350 is subsequently removed, a case (as shown in FIG. 1B) in which an initial support layer 340 in the array region 300A is worn to entirely remove the mask layer 350 in the peripheral region 300B does not occur, thereby preventing a thickness of the initial support layer 340 in the array region 300A from being smaller than a thickness of an initial support layer 340 in the peripheral region 300B.

In this step, the thickness of the mask layer 350 in the peripheral region 300B is reduced. In this embodiment, the step includes the following steps.

Referring to FIG. 3D, a photoresist layer 400 is formed in the array region 300A, where the photoresist layer 400 covers the mask layer 350 and the lower electrode 390. In some embodiments of the present disclosure, limited by actual processes, the photoresist layer 400 also covers the surface of the mask layer 350 in the peripheral region 300B, and this step further includes a step of removing the photoresist layer 400 covering the surface of the mask layer 350 in the peripheral region 300B.

The mask layer 350 in the peripheral region 300B is etched using the photoresist layer 400 as a mask, to remove part of the mask layer in the peripheral region 300B, such that the thickness of the remaining mask layer 350 in the peripheral region 300B is equal to the thickness of the mask layer 350 in the array region 300A. In this step, an etching rate of an etching substance to the mask layer 350 is greater than an etching rate of the etching substance to the lower electrode 390, to prevent the lower electrode 390 from being etched. For example, the mask layer 350 is dry-etched by using at least one of HBr and $NF_3$ as an etching gas, and the etching rate of the etching gas HBr or $NF_3$ to the mask layer 350 is greater than the etching rate of the etching gas HBr or $NF_3$ to the lower electrode 390.

Referring to FIG. 3E, after the etching is completed, the photoresist layer 400 is removed by means of, for example, an ashing process, such that the mask layer 350 is exposed.

Figure 3F:
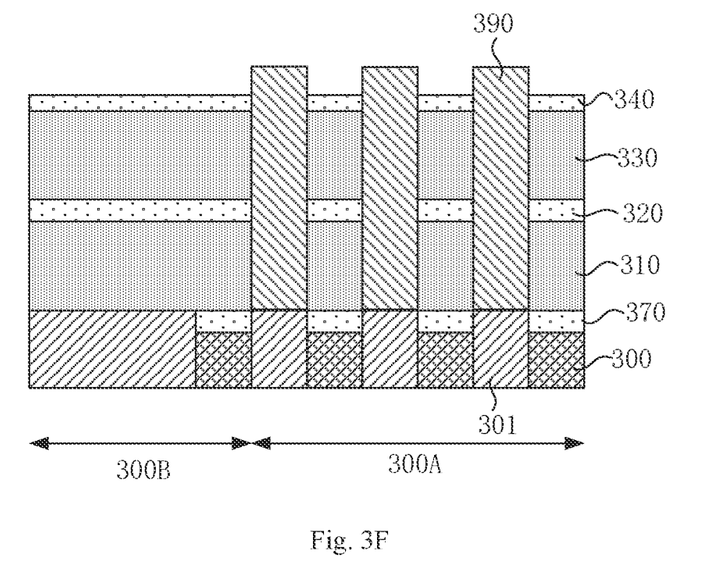

In Step S23, referring to FIG. 3F, the remaining mask layer 350 in the peripheral region 300B and the mask layer 350 in the array region 300A are removed to expose the initial support layer 340.

In this step, the mask layer 350 is removed by means of a dry etching process. The etching rate of the etching substance to the mask layer 350 is greater than the etching rate of the etching substance to the lower electrode 380, to prevent the lower electrode 380 from being etched. In this embodiment, the mask layer 350 is a polysilicon mask layer, and the lower electrode 390 is a titanium nitride electrode. The mask layer 350 may be dry-etched by using at least one of HBr and NF3 as the etching gas, to remove the mask layer 350. The etching rate of the etching gas HBr or $NF_3$ to polysilicon is greater than the etching rate of the etching gas HBr or $NF_3$ to titanium nitride.

In this step, limited by an actual process, the initial support layer 340 is also thinned. However, because the thickness of the remaining mask layer 350 in the peripheral region 300B is equal to the thickness of the mask layer 350 in the array region 300A, a degree of thinning the initial support layer 340 in the peripheral region 300B is equal to a degree of thinning the initial support layer 340 in the array region 300A, such that after this step, a thickness of a remaining initial support layer 340 in the peripheral region 300B is also equal to a thickness of a remaining initial support layer 340 in the array region 300A.

Figure 3G:
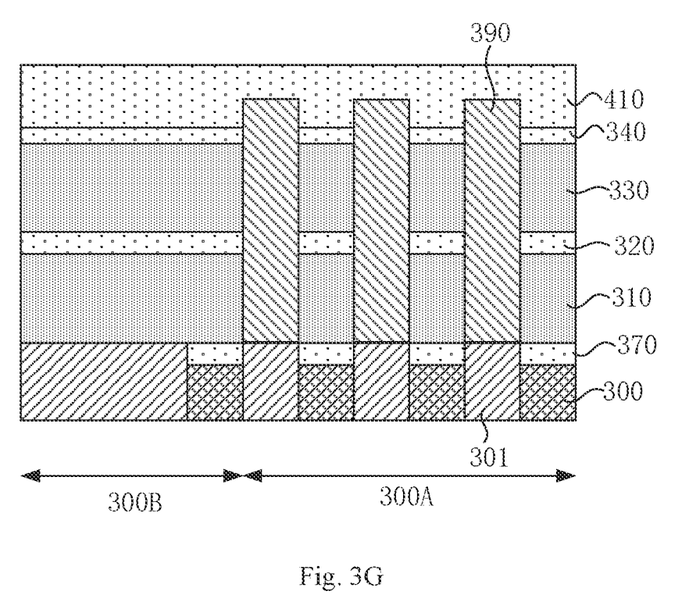
Figure 3H:
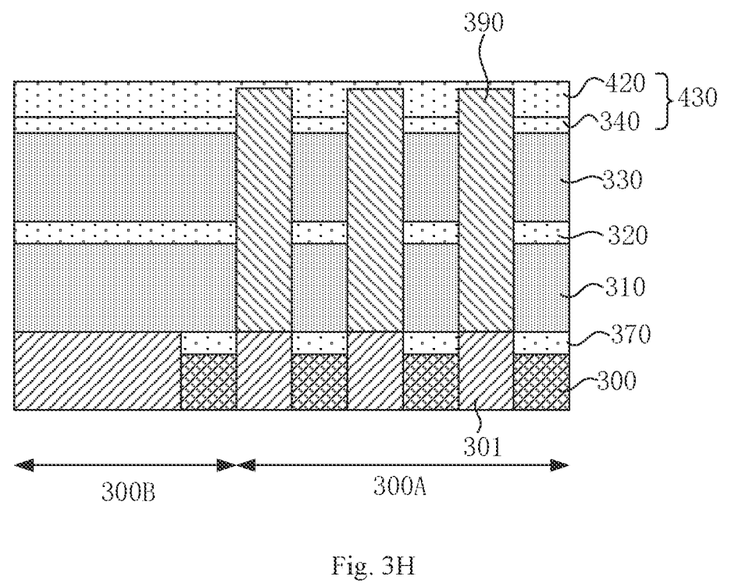

In Step S24, referring to FIG. 3G and FIG. 3H, a supplementary support layer 420 is formed on the initial support layer 340, where the initial support layer 340 and the supplementary support layer 420 together serve as the top support layer 430.

In this step, a supplementary support layer 420 is formed through deposition on a surface of the initial support layer 340. In this embodiment, the step includes the following steps.

Referring to FIG. 3G, a cladding material 410 is formed on the initial support layer 340, and an upper surface of the cladding material 410 is a flat surface. In this step, the deposited cladding material 410 is thick enough such that the upper surface of the cladding material 410 is a flat surface. That is, an upper surface of a cladding material positioned in the peripheral region 300B and an upper surface of a cladding material positioned in the array region 300A are in a same horizontal position, thereby further removing a thickness difference between a supplementary support layer 420 formed in the peripheral region 300B and a supplementary support layer 420 formed in the array region 300A.

Referring to FIG. 3H, a portion of the capping material 410 is etched to form the supplementary support layer 420. In this step, the cladding material 410 may be etched by means of a dry etching process, such that the cladding material 410 is thinned to a predetermined thickness to form the supplementary support layer 420.

In this embodiment, the supplementary support layer 420 also covers a top of the lower electrode 390 to prevent the lower electrode 390 from being etched in the subsequent step of patterning the intermediate support layer.

In some embodiments, the initial support layer 340 has a same material as the supplementary support layer 420. For example, both the initial support layer 340 and the supplementary support layer 420 are silicon nitride layers. In some embodiments, a thickness of a top support layer 430 constitute by the initial support layer 340 and the supplementary support layer 420 is the same as a thickness of an intermediate support layer 320.

Figure 3I:
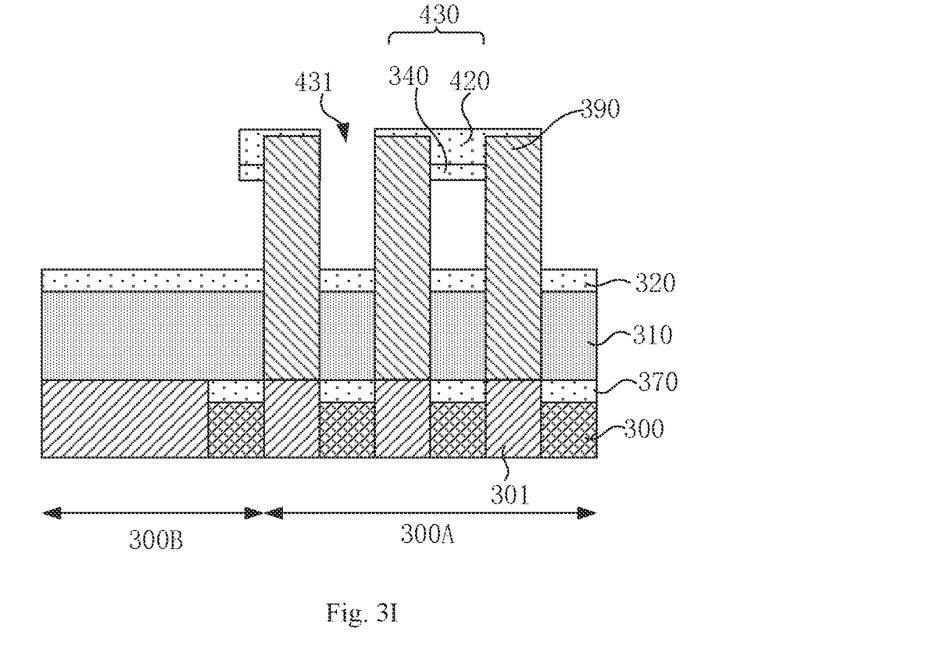

In Step S25, referring to FIG. 3I, the top support layer 430 is patterned, and the second sacrificial layer 330 is removed.

In some embodiments, in this step, the top support layer 430 is patterned to form a first opening 431, and the second sacrificial layer 330 is removed along the first opening 431 to expose the intermediate support layer 320. Processes for patterning the intermediate support layer 430 may be a photolithography process and a dry etching process, and a process for removing the second sacrificial layer 330 may be a wet etching process.

Figure 3J:
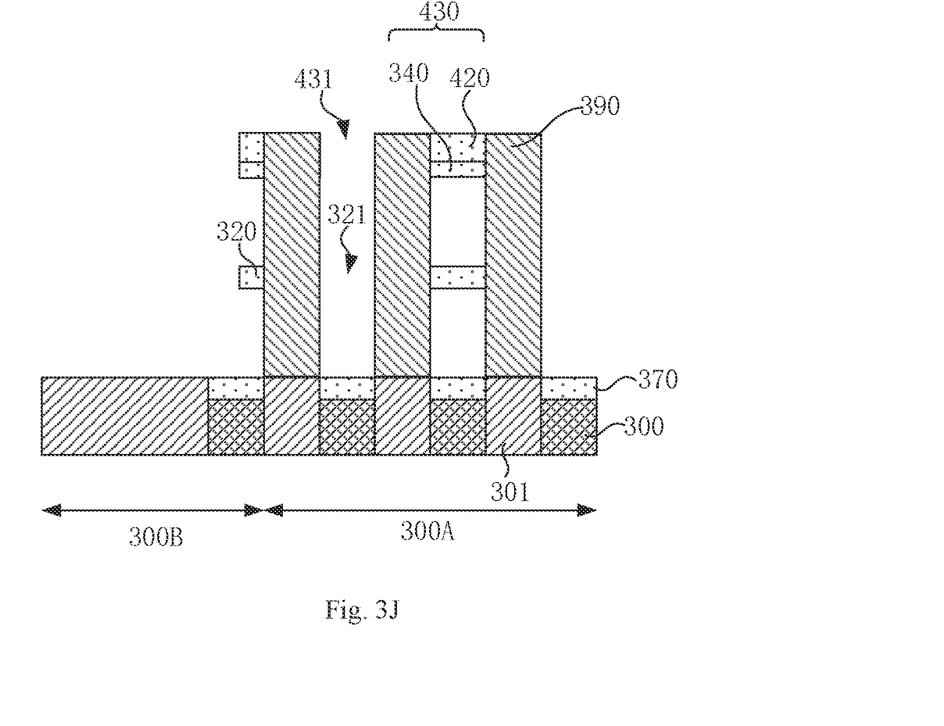

In Step S26, referring to FIG. 3J, the intermediate support layer 320 is patterned, and the first sacrificial layer 310 is removed.

In some embodiments, in this step, the intermediate support layer 320 is patterned to form a second opening 321. A position of the second opening 321 corresponds to that of the first opening 431. The first sacrificial layer 310 is removed along the second opening 321 to expose the substrate 300. Processes for patterning the intermediate support layer 320 may be a photolithography process and a dry etching process, and a process for removing the first sacrificial layer 310 may be a wet etching process.

In the step of patterning the intermediate support layer 320, the supplementary support layer 420 is also thinned, and the supplementary support layer 420 positioned on the top of the lower electrode 390 is removed, such that the top of the lower electrode 390 is exposed. In this embodiment, after the first sacrificial layer 310 is removed, the bottom support layer 370 is exposed.

Figure 3K:
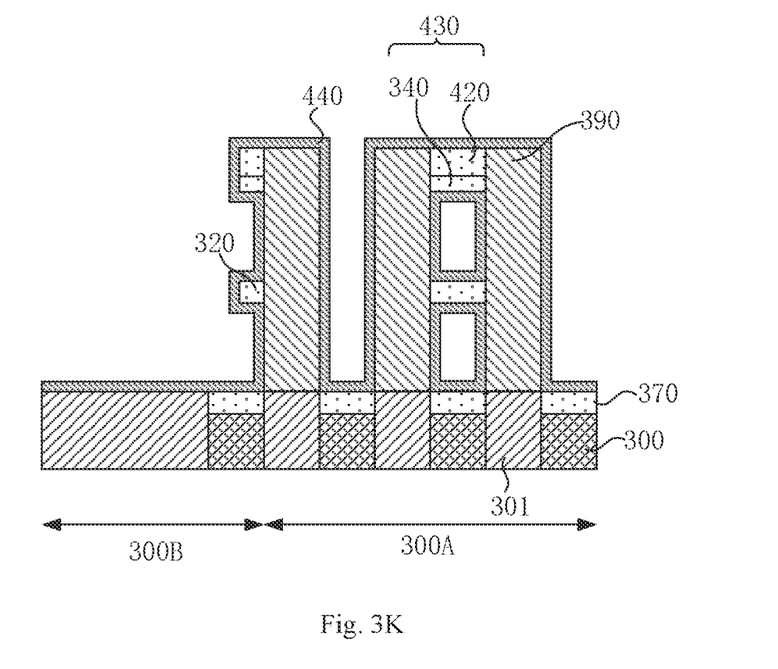

In Step S27, referring to FIG. 3K, a dielectric layer 440 is formed, where the dielectric layer 440 covers exposed surfaces of the substrate 300, the lower electrode 390, the intermediate support layer 320, and the top support layer 430.

The dielectric layer 440 may be a high-K dielectric layer to improve the performance of the columnar capacitor. For example, the high-K dielectric layer may be $Al_2O_3$, $HfO_2$, $Ta_2O_5$, and $ZrO_2$, which may be formed by means of chemical vapor deposition (CVD), atomic layer deposition (ALD), or metal organic chemical vapor deposition (MOCVD), etc.

Figure 3L:
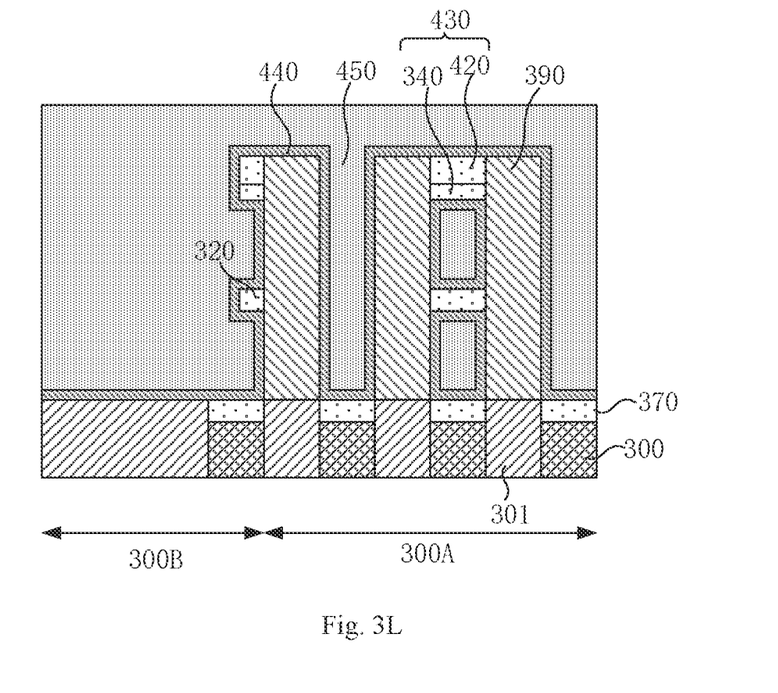

In Step S28, referring to FIG. 3L, an upper electrode 450 is formed, where the upper electrode 450 covers a surface of the dielectric layer 440. In this embodiment, the upper electrode 450 fills voids between the bottom support layer 370; and the intermediate support layer 320 and the top support layer 430, and covers the top support layer 430. The upper electrode 450, the dielectric layer 440 and the lower electrode 390 constitute the columnar capacitor. A plurality of columnar capacitors are arranged in an array to constitute an array structure of the columnar capacitor.

In the method for fabricating the array structure of the columnar capacitor in the present disclosure, before the mask layer is removed, the thickness of the mask layer in the peripheral region is first adjusted to be equal to the thickness of the mask layer in the array region, thereby avoiding having a negative effect on the thickness of the top support layer due to different thicknesses of the mask layer. Moreover, in the method of the present disclosure, the thickness of the top support layer is increased by forming the supplementary support layer, to increase support strength of the top support layer, thereby further preventing occurrence of tilt of the columnar capacitor due to insufficient support strength of the top support layer.

The present disclosure also provides a semiconductor structure. Referring to FIG. 3H, the semiconductor structure includes a substrate 300, multiple conductive pads 301 are disposed in the substrate 300, and the substrate 300 is divided into the array region 300A and the peripheral region 300B.

The substrate 300 may include a silicon substrate, a germanium (Ge) substrate, a silicon germanium (SiGe) substrate, a silicon-on-insulator (SOI) substrate or a germanium-on-insulator (GOI) substrate, etc. The substrate 300 may also be a substrate including other elemental semiconductors or compound semiconductors, such as gallium arsenide, indium phosphide, or silicon carbide, etc., and the substrate 300 may also be a stacked structure, such as a silicon/germanium silicon stack, etc. In addition, the substrate 300 may be an ion-doped substrate, which may be P-type doped or N-type doped. In the substrate 300, a plurality of peripheral devices may also be formed, such as field effect transistors, capacitors, inductors and/or P-N junction diodes, etc. In this embodiment, the substrate 300 is the silicon substrate, which further includes other device structures, such as a bit line structure, a transistor structure, etc., which are not shown because they are not related to the present disclosure.

The first sacrificial layer 310, the intermediate support layer 320, the second sacrificial layer 330 and the top support layer 430 are stacked on the substrate 300. The surface of the top support layer 430 positioned in the array region 300A is flush with the surface of the top support layer 430 positioned in the peripheral region 300B.

In this embodiment, the material of the first sacrificial layer 310 and the material of the second sacrificial layer 330 may be oxides such as silicon oxide; and the material of the intermediate support layer 320 may be nitrides such as silicon nitride.

In some embodiments, the thickness of the top support layer 430 is equal to that of the intermediate support layer 320.

The top support layer 430 includes an initial support layer 340 and a supplementary support layer 420 covering the initial support layer 340. In some embodiments, the initial support layer 340 and the supplementary support layer 420 have the same material, i.e., silicon nitride.

In this embodiment, a bottom support layer 370 is further provided on the substrate 300. The bottom support layer 370 covers the substrate 300 and exposes the conductive pads 301, and the first sacrificial layer 310 covers the bottom support layer 370. A material of the bottom support layer 370 may be nitrides such as silicon nitride.

The lower electrode 390 is arranged in the array region 300A, where the lower electrode 390 penetrates through the top support layer 430, the second sacrificial layer 330, the intermediate support layer 320 and the first sacrificial layer 310, and the lower electrode 390 is electrically connected to the conductive pad 301. The lower electrode 390 may be a titanium nitride electrode. The top of the lower electrode 390 may be flush with the surface of the top support layer 430, or the top support layer 430 may cover the top of the lower electrode 390. For example, in this embodiment, the top support layer 430 covers the top of the lower electrode 390.

In the semiconductor structure of the present disclosure, the top support layer comprises the initial support layer and the supplementary support layer, and the surface of the top support layer positioned in the array region is flush with the surface of the top support layer positioned in the peripheral region, which greatly increases the thickness and the support strength of the top support layer, prevent the column capacitor formed on the basis of the semiconductor structure from tilting, and improve the performance of the memory formed subsequently.

What is mentioned above merely refers to embodiments of the present disclosure. It shall be pointed out that to those of ordinary skill in the art, various improvements and embellishments may be made without departing from the principle of the present disclosure, and these improvements and embellishments are also deemed to be within the scope of protection of the present disclosure.

What is claimed is:

1. A method for fabricating an array structure of a columnar capacitor, comprising:
    providing a substrate provided with multiple conductive pads therein, wherein a first sacrificial layer, an intermediate support layer, a second sacrificial layer, an initial support layer, and a mask layer are stacked on the substrate, the substrate being divided into an array region and a peripheral region, a thickness of the mask layer positioned in the array region being less than a thickness of the mask layer positioned in the peripheral region, and multiple capacitor holes in the array region penetrating through the mask layer, the initial support layer, the second sacrificial layer, the intermediate support layer and the first sacrificial layer, to expose the multiple conductive pads;
    filling a conductive material in the multiple capacitor holes to form a lower electrode of the columnar capacitor, wherein the lower electrode is electrically connected to the multiple conductive pads;
    removing a part of the mask layer in the peripheral region, such that a thickness of a remaining part of the mask layer in the peripheral region is equal to a thickness of the mask layer in the array region;
    removing the remaining part of the mask layer in the peripheral region and the mask layer in the array region to expose the initial support layer;
    forming a supplementary support layer on the initial support layer, wherein the initial support layer and the supplementary support layer jointly function as a top support layer;
    patterning the top support layer and removing the second sacrificial layer;
    patterning the intermediate support layer and removing the first sacrificial layer;
    forming a dielectric layer, wherein the dielectric layer covers exposed surfaces of the substrate, the lower electrode, the intermediate support layer, and the top support layer; and
    forming an upper electrode covering a surface of the dielectric layer.

2. The method for fabricating the array structure of the columnar capacitor according to claim 1, wherein the filling the conductive material in the capacitor hole to form the lower electrode of the columnar capacitor further comprises:
    further covering, by the conductive material, a surface of the mask layer in the array region and a surface of the mask layer in the peripheral region, and etching back the conductive material to expose the mask layer.

3. The method for fabricating the array structure of the columnar capacitor according to claim 1, wherein the removing the part of the mask layer in the peripheral region, such that the thickness of the remaining part of the mask layer in the peripheral region is equal to the thickness of the mask layer in the array region further comprises:
    forming a photoresist layer in the array region, wherein the photoresist layer covers the mask layer and the lower electrode;
    etching the mask layer in the peripheral region by using the photoresist layer as a mask, to remove the part of the mask layer in the peripheral region; and
    removing the photoresist layer.

4. The method for fabricating the array structure of the columnar capacitor according to claim 3, wherein in the etching the mask layer in the peripheral region by using the photoresist layer as the mask, an etching rate of an etching substance to the mask layer is greater than an etching rate of the etching substance to the lower electrode.

5. The method for fabricating the array structure of the columnar capacitor according to claim 1, wherein in the removing the remaining part of the mask layer in the peripheral region and the mask layer in the array region to expose the initial support layer, an etching rate of an etching substance to the mask layer is greater than an etching rate of the etching substance to the lower electrode.

6. The method for fabricating the array structure of the columnar capacitor according to claim 5, wherein further, the mask layer is a polysilicon mask layer, and the lower electrode is a titanium nitride electrode.

7. The method for fabricating the array structure of the columnar capacitor according to claim 1, wherein the forming the supplementary support layer on the initial support layer further comprises:
    forming a cladding material on the initial support layer, wherein an upper surface of the cladding material is a flat surface; and
    etching part of the cladding material, to form the supplementary support layer.

8. The method for fabricating the array structure of the columnar capacitor according to claim 7, wherein further, a material of the initial support layer is the same as a material of the supplementary support layer.

9. The method for fabricating the array structure of the columnar capacitor according to claim 1, wherein further, a thickness of the top support layer is equal to a thickness of the intermediate support layer.

10. The method for fabricating the array structure of the columnar capacitor according to claim 1, wherein the patterning the top support layer and removing the second sacrificial layer further comprises:

patterning the top support layer to form a first opening; and removing the second sacrificial layer along the first opening to expose the intermediate support layer.

11. The method for fabricating the array structure of the columnar capacitor according to claim 10, wherein the patterning the intermediate support layer and removing the first sacrificial layer further comprises:

patterning the intermediate support layer to form a second opening; and removing the first sacrificial layer along the second opening to expose the substrate.

12. The method for fabricating the array structure of the columnar capacitor according to claim 11, wherein further, a position of the first opening corresponds to a position of the second opening.

13. The method for fabricating the array structure of the columnar capacitor according to claim 1, further comprising a bottom support layer, wherein the bottom support layer covers the substrate, and the conductive pad is exposed; and after the patterning the intermediate support layer and removing the first sacrificial layer, the bottom support layer is exposed.

* * * * *